United States Patent
Thoener et al.

(10) Patent No.: US 9,741,471 B2
(45) Date of Patent: Aug. 22, 2017

(54) SEMIFINISHED WIRE WITH PIT ELEMENTS FOR A SUPERCONDUCTING WIRE CONTAINING NB3SN AND METHOD OF PRODUCING THE SEMIFINISHED WIRE

(71) Applicant: Bruker EAS GmbH, Hanau (DE)

(72) Inventors: Manfred Thoener, Biebergemuend (DE); Bernd Sailer, Alzenau (DE)

(73) Assignee: Bruker EAS GmbH, Hanau (DE)

( * ) Notice: Subject to any disclaimer, the term of this patent is extended or adjusted under 35 U.S.C. 154(b) by 233 days.

(21) Appl. No.: 15/049,154

(22) Filed: Feb. 22, 2016

(65) Prior Publication Data
US 2016/0247606 A1    Aug. 25, 2016

(30) Foreign Application Priority Data
Feb. 24, 2015 (DE) .......................... 10 2015 203 305

(51) Int. Cl.
| H01B 12/02 | (2006.01) |
| H01L 39/24 | (2006.01) |
| H01B 13/14 | (2006.01) |

(52) U.S. Cl.
CPC ............. H01B 12/02 (2013.01); H01B 13/14 (2013.01); H01L 39/2409 (2013.01)

(58) Field of Classification Search
USPC ....................................................... 174/125.1
See application file for complete search history.

(56) References Cited

U.S. PATENT DOCUMENTS

| 3,618,205 | A | * | 11/1971 | Barber | ..................... H01L 39/14 |
| | | | | | 174/125.1 |
| 3,963,425 | A | * | 6/1976 | Sambrook | ............... H01L 39/14 |
| | | | | | 174/125.1 |
| 4,055,887 | A | * | 11/1977 | Meyer | ................ H01L 39/2409 |
| | | | | | 29/419.1 |
| 4,411,712 | A | | 10/1983 | Marancik | |
| 4,863,804 | A | * | 9/1989 | Whitlow | ............ G01R 33/3815 |
| | | | | | 174/125.1 |
| 5,088,183 | A | * | 2/1992 | Kanithi | ................... H01L 39/14 |
| | | | | | 257/E39.017 |

(Continued)

FOREIGN PATENT DOCUMENTS

| EP | 1 705 721 | 12/2010 |
| EP | 2 713 413 | 4/2014 |

(Continued)

*Primary Examiner* — Timothy Thompson
*Assistant Examiner* — Krystal Robinson
(74) *Attorney, Agent, or Firm* — Paul Vincent

(57) ABSTRACT

A semifinished wire (1) for a superconducting wire containing Nb3Sn has a Cu stabilization cladding tube (2), a ring-shaped closed diffusion barrier (3) in the inside of the Cu stabilization cladding tube (2) and a plurality of PIT elements (6) in the inside of the diffusion barrier (3), each having a cladding (8) containing Cu, a small tube (9), and a powder core (10) containing Sn. The small tube (9) consists of Nb or an alloy containing Nb and the diffusion barrier (3) has a percentage of area ADF in cross-section of the semifinished wire (1) of 3% ADF 9% and a wall thickness WDF with 8 µm≤WDF≤25 µm. A plurality of filler elements (5) are arranged inside the diffusion barrier (3), with the inner sides of the filler elements (5) abutting the PIT elements (6).

24 Claims, 7 Drawing Sheets

(56) References Cited

U.S. PATENT DOCUMENTS

| | | |
|---|---|---|
| 7,514,634 B2 | 4/2009 | Roth |
| 8,173,901 B2 | 5/2012 | Thoener |
| 2009/0036312 A1 | 2/2009 | Thoener |
| 2014/0096997 A1 | 4/2014 | Schlenga |
| 2014/0287929 A1 | 9/2014 | Thoener |

FOREIGN PATENT DOCUMENTS

| | | |
|---|---|---|
| JP | 2009004128 | 1/2009 |
| WO | WO 2006/011170 | 2/2006 |

* cited by examiner

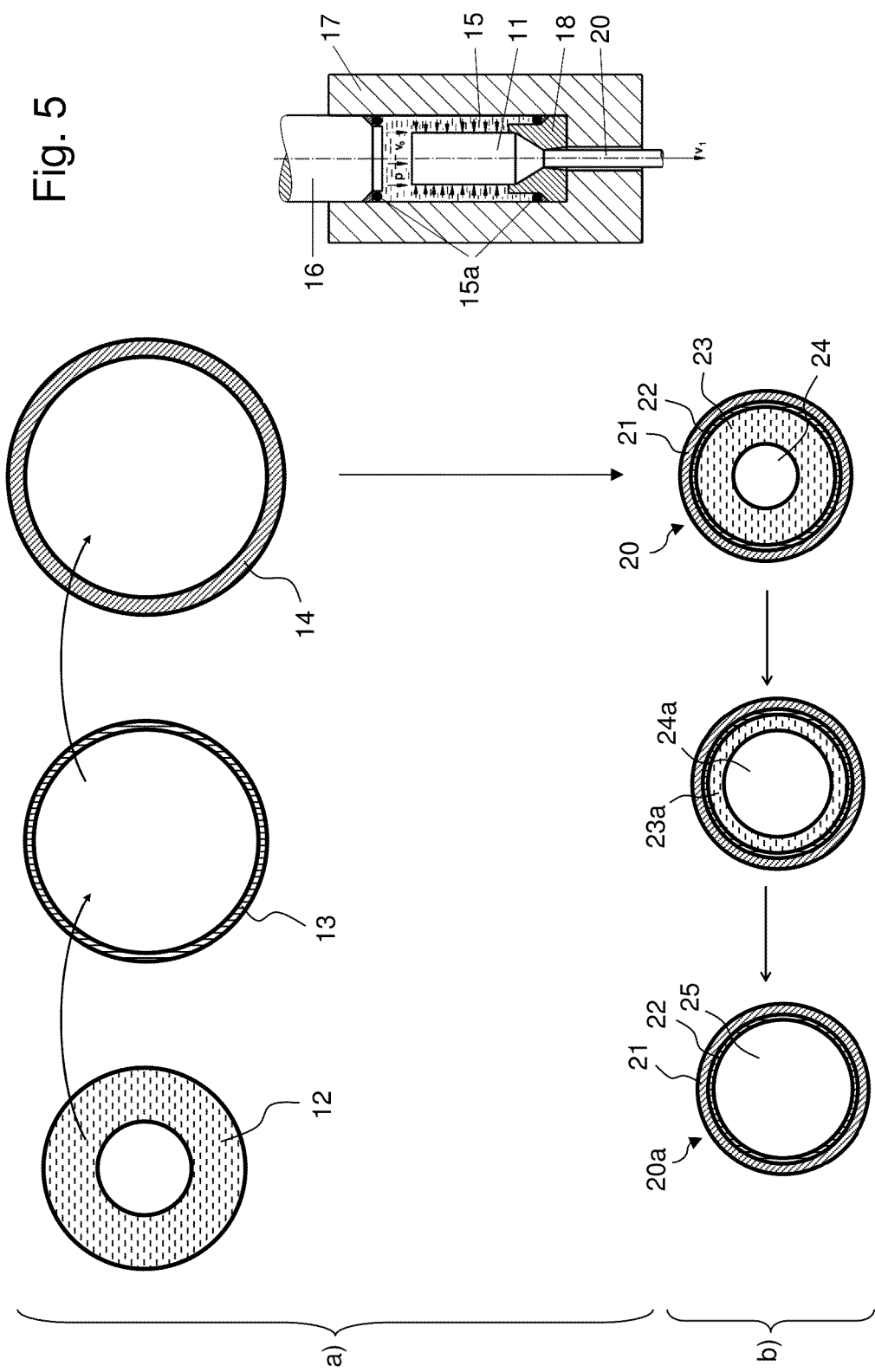

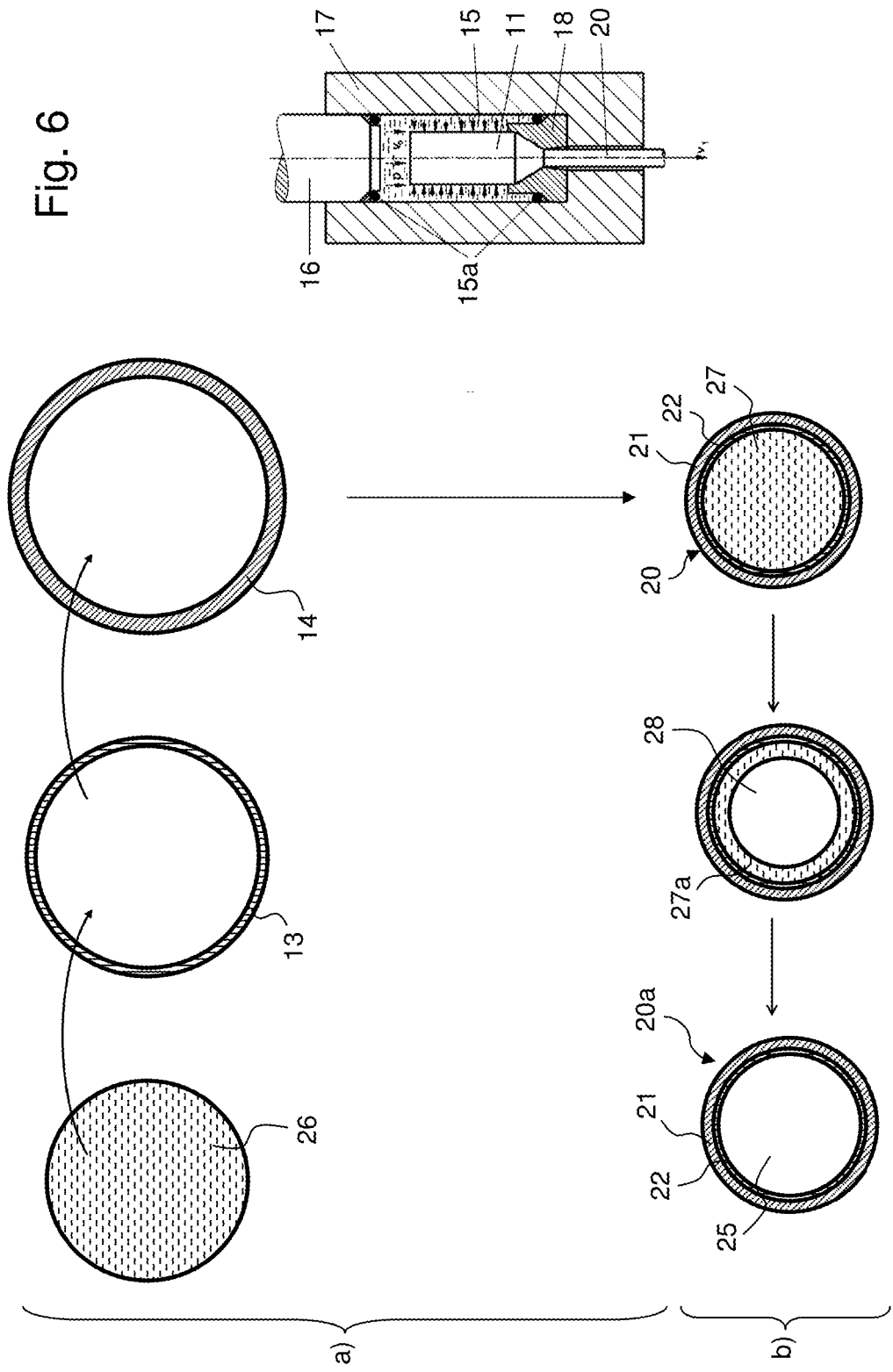

SEMIFINISHED WIRE WITH PIT ELEMENTS FOR A SUPERCONDUCTING WIRE CONTAINING NB3SN AND METHOD OF PRODUCING THE SEMIFINISHED WIRE

This application claims Paris convention priority from DE 10 2015 203 305.8 filed Feb. 24, 2015, the entire disclosure of which is hereby incorporated by reference.

BACKGROUND OF THE INVENTION

The invention concerns a semifinished wire for a superconducting wire containing Nb3Sn, comprising
a Cu stabilization cladding tube,
a ring-shaped closed diffusion barrier in the inside of the Cu stabilization cladding tube,
a plurality of PIT elements in the inside of the diffusion barrier, each comprising
a cladding containing Cu,
a small tube, and
a powder core containing Sn
The invention also concerns a method of producing such a semifinished wire.

A semifinished wire and a method of producing a semifinished wire are disclosed in EP 1 983 583 B1.

Nb3Sn superconducting wires are used to carry high electric currents quasi without loss, in particular in superconducting magnet coils for generating strong magnetic fields. Nb3Sn achieves higher current densities than other metallic superconducting materials (such as NbTi) and can be used in stronger magnetic fields, but is a relatively brittle material which cannot be plastically deformed (or only to a minimum extent). In particular, Nb3Sn cannot be subjected to wire drawing.

For this reason, Nb3Sn superconducting wires are generally produced in that a semifinished wire is initially produced which can be easily plastically deformed, contains the chemical elements which are required to form Nb3Sn, and is brought into the desired shape for the desired application, e.g. is wound as a solenoid coil. This is followed by reaction annealing during which the brittle superconducting A15 phase is generated.

Nb3Sn superconducting wires are produced in practice in most cases via the "bronze route" in which Nb rods are arranged in a matrix of a CuSn alloy ("bronze") in the semifinished wire. Semifinished wires of this type can be easily deformed and drawn. In the "internal tin" route, Nb rods and Sn blocks, often in a Cu matrix, are provided in the semifinished wire. In this connection, large amounts of tin can be provided and a correspondingly large percentage of area of Nb3Sn in the finished wire can be achieved. However, tin is relatively soft in comparison with copper, which aggravates handling of the semifinished wire, in particular during drawing. In the "powder in tube" (PIT) route, powder containing Sn is usually arranged in small Nb tubes. Also in this case, large amounts of Sn can be provided and high current carrying capacities can be achieved.

EP 1 983 583 B1 discloses the production of a semifinished wire for an Nb3Sn superconducting wire by arranging a bundle of hexagonal PIT elements in an outer jacket. The outer jacket comprises an outer cladding tube of Cu, a middle cladding tube of Ta and an inner cladding tube of Cu. The outer jacket is produced by hydrostatic extrusion, wherein extrusion is followed by drilling out a core. Each PIT element comprises a Cu jacket and a powder metallurgical core. The outer jacket with the included PIT elements is deformed by means of drawing and intermediate annealing steps and is finally subjected to reaction annealing. The middle cladding tube has a percentage of 10-25% of the overall multifilament and is used for mechanical reinforcement to increase the yield point. For this reason, the finished Nb3Sn superconducting wire shows an improved resistance to the Lorentz forces that occur in magnet systems, thus providing higher current carrying capacities.

EP 1 983 582 A2 describes a similar semifinished wire, in which hexagonal PIT elements are surrounded by hexagonal reinforcing filaments which each comprise a Ta core clad by Cu. The PIT elements and the reinforcing filaments are arranged in an outer jacket of Cu. The reinforcing filaments again serve as mechanical reinforcement.

In addition to superconducting filaments, superconducting wires also contain a normally conducting portion with good electrical conductivity, typically of high purity Cu. The normally conducting portion with good conductivity provides a current path parallel to the superconducting filaments and, in case the superconductor changes into the normally conducting state, takes over the current that has been flowing in the previously superconducting filaments. This prevents destruction of the superconducting wire.

DE 10 2012 218 222 A1 discloses a semifinished wire for an Nb3Sn superconducting wire on the basis of an "internal tin" route. A plurality of hexagonal elements containing Nb, a central structure containing Sn and a Cu matrix are arranged in a Cu cladding tube with a diffusion barrier of Ta and/or Nb on the inner side. The diffusion barrier prevents diffusion of Sn into the Cu cladding tube, thereby preventing deterioration of the electrical properties of this Cu stabilization. A similar Nb3Sn superconducting wire is also disclosed in EP 2 713 413 A2.

DE 10 2004 035 852 B4 discloses an initial filament structure on the basis of "powder in tube" for a superconducting conductor element with Nb3Sn, wherein a plurality of filaments are arranged in a Cu matrix. Each filament comprises a tube which contains Nb and is filled with powder of Sn or an Sn alloy. Each tube is surrounded by a Ta cladding in order to prevent diffusion of Sn into the Cu matrix. A single-core conductor on the basis of "powder in tube" with a Ta barrier is also known from EP 1 705 721 B1.

U.S. Pat. No. 4,411,712 proposes to clad Nb rods with a CuSn alloy and to arrange them in bundles in a tube of high purity Cu. The tube may be provided with a layer of a material that prevents diffusion of Sn, e.g. Ta, in order to obtain high conductivity of the high purity Cu.

WO 2006/011170 A1 moreover discloses a ring-shaped diffusion barrier around a conductive core that is surrounded by MgB2 filaments for an MgB2 superconducting wire.

It is the underlying purpose of the invention to provide a semifinished wire for a superconducting wire containing Nb3Sn and a method for producing a semifinished wire of this type, by means of which a particularly high current carrying capacity can be achieved, at the same time ensuring high conductivity Cu stabilization.

SUMMARY OF THE INVENTION

This object is achieved by a semifinished wire of the above-mentioned type which is characterized in that the small tube consists of Nb or an alloy containing Nb, that the diffusion barrier has a percentage of area ADF in cross-section of the semifinished wire of $3\% \leq ADF \leq 9\%$ and moreover has a wall thickness WDF with $8\ \mu m \leq WDF \leq 25\ \mu m$, and that moreover a plurality of filler elements are arranged inside the diffusion barrier, wherein the inner sides of the filler elements abut the PIT elements.

This object is further achieved by a method for producing a semifinished wire in accordance with the invention, comprising the following steps:

a) an outer jacket is produced by extrusion, in particular hydrostatic extrusion, wherein the outer jacket comprises a pre-Cu stabilization cladding tube, a pre-diffusion barrier within the pre-Cu stabilization cladding tube and a pre-inner element within the pre-diffusion barrier, wherein the material for the pre-inner element is selected such that immediately prior to plastic deformation by extrusion, an average particle size MKI of the material for the pre-inner element is maximally 3 times as large as an average particle size MKD of the material for the pre-diffusion barrier, b) at least part of the pre-inner element is removed from the outer jacket along the length of the outer jacket, c) a plurality of pre-PIT elements is arranged together with a plurality of pre-filler elements within the pre-diffusion barrier, wherein the pre-filler elements abut an inner side of the remained outer jacket and also abut the pre-PIT elements, d) the pre-semifinished wire obtained in this fashion is subjected to cross-section-reducing shaping to obtain the semifinished wire.

In accordance with the present invention, in a "powder in tube" semifinished wire, a diffusion barrier for Sn is provided in the inside of which a plurality (typically 50 or more, mostly 100 or more) PIT elements are arranged. The diffusion barrier blocks diffusion of Sn from the inside of the semifinished wire, in particular from the PIT elements, into the Cu stabilization cladding tube during reaction annealing. This prevents soiling of the Cu stabilization cladding tube (which consists of high purity copper) such that a high residual resistance ratio RRR in the Cu stabilization tube can be reliably achieved.

In accordance with the invention, the percentage of area for a diffusion barrier as protection for the Cu stabilization tube is minimized. In this fashion, a larger percentage of area can be provided for the finished superconductor, thereby increasing the current carrying capacity.

In accordance with the invention, the ring-shaped closed diffusion barrier is used for a plurality of PIT elements, which facilitates the production of the semifinished wire and also keeps the area required for the protection of the CU stabilization small.

The overall percentage of area of the one circumferential diffusion barrier in the semifinished wire is furthermore selected to be smaller than usual up to now e.g. for Ta middle tubes in semifinished wires in the "powder in tube" route. In accordance with the "powder in tube" route, a Ta middle tube was used for mechanical stabilization with a percentage of area of 10-25%, cf. EP 1 983 583 B1. In accordance with the invention, it has been determined that a middle tube which consists of a material that is impenetrable for Sn through diffusion during reaction annealing ("diffusion barrier"), such as tantalum or niobium, and which has a percentage of area of the semifinished wire of 9% or less, preferably 8% or less, and preferentially 7% or less, is sufficient in order to meet the function as diffusion barrier in the "powder in tube" route.

In accordance with the invention, a wall thickness of the diffusion barrier of 25 µm or less, preferably 22 µm or less, preferentially 20 µm or less is accordingly used in the (already drawn) semifinished wire.

In order to obtain these small diffusion barrier wall thicknesses and at the same time ensure that the diffusion barrier does not leak (have an opening) at any point of its circumference, in accordance with the invention, the PIT elements abut filler elements which again abut the inner side of a (shaped) outer jacket of the semifinished wire. The PIT elements generally do not directly abut the inner side of the (shaped) outer jacket.

Prior to cross-section-reducing shaping of the not yet deformed semifinished wire ("pre-semifinished wire"), the inside of the outer jacket can then be filled practically free of voids by means of the pre-filler elements and the pre-PIT elements. This reduces the waviness of the diffusion barrier after cross-section-reducing shaping. In particular, there is no waviness caused by filling the voids close to the inner side of the outer jacket. The less wavy, the smaller is the risk of a leakage (opening) in the diffusion barrier.

It should be noted that structures of the semifinished wire prior to cross-section-reducing shaping, which correspond to structures of the semifinished wire after cross-section-reducing shaping, are herein designated using the prefix "pre".

A further reduction of the waviness of the diffusion barrier is achieved within the scope of the inventive method in that materials with matched particle sizes are used for the pre-diffusion barrier and the pre-inner element. In accordance with the invention, the following applies to the average particle size MKI of the (metallic) material for the pre-inner element and the average particle size MKD of the (metallic) material for the pre-diffusion barrier: MKI≤3*MKD. Furthermore, preferably MKI≤1·MKD. This data refers to the situation directly prior to extrusion, i.e. after heating of the material to the respective extrusion temperature but prior to passage through the die of the extruder.

In accordance with the invention, the particle size of the material for the pre-inner element may not be too large compared with the material for the diffusion barrier. This precludes waviness along the circumference of the pre-diffusion barrier or even formation of an axial groove in the pre-diffusion barrier, in particular on the side of the diffusion barrier facing the pre-inner element, which, in case of further cross-section-reducing shaping, can lead to an even stronger waviness and eventually to the formation of gaps in the diffusion barrier. MKI is typically maximally 50 µm, preferably 15-40 µm. MKD is typically maximally 90 µm and preferably 35-60 µm for Ta and 25-45 µm for Nb.

It should be noted that during heating of the materials for the outer jacket prior to extrusion (typically to at least 450° C., mostly to approximately 500° C.), substantial particle growth can develop. For this reason, pure copper, in particular with a cast structure which has a considerable particle size and shows further particle growth in this temperature range, is generally not suited as material for the pre-inner element. Mainly Cu alloys, in particular CuSn, have proven to be useful in practice as material for the pre-inner element.

The presence of the pre-inner element is particularly advantageous for extrusion shaping since, due to the friction characteristics, contact between the Nb or Ta pre-diffusion barrier and the extrusion tool is problematic. After extrusion, at least part of the cross-sectional surface of the pre-inner element is removed in order to keep the cross-sectional portion available for Nb3Sn as large as possible.

The inventive measures ensure that the diffusion barrier does not leak during production of the semifinished wire despite its small percentage of cross-sectional area or its small wall thickness, which could lead to Sn contamination of the high purity copper in the Cu stabilization cladding tube during subsequent reaction annealing. In particular, a reliable sealing effect can be provided even when deformations that normally occur during production of (semifinished) cables, are introduced into the semifinished wire.

Due to the reliable sealing effect of the diffusion barrier, the substance conversion of Nb (and, if necessary, supplementary elements) and Sn in the PIT elements into a superconducting A15 phase can be performed with a particularly high conversion degree (percentage of the reacted Nb in relation to Nb used) since a breakthrough of Sn through the small tubes containing Nb is basically unproblematic. Instead, the reaction annealing time can be increased and/or the reaction annealing temperature can be increased, or the Sn content of the powder in the small tubes containing Nb can also be increased compared with conventional semifinished wires on the basis of "powder in tube". In particular, the loss of area due to the diffusion barrier can be overcompensated for with respect to the current carrying capacity in comparison with a "powder in tube" superconducting wire without diffusion barrier.

On the whole, the invention achieves a particularly high current carrying capacity of the finished superconducting wire containing Nb3Sn, wherein the latter reliably exhibits a high residual resistance ratio (RRR value). The invention achieves, in particular, a current carrying capacity of 1400 A/mm$^2$ (with 15 T and 4.2 K) or 2400 A/mm$^2$ (with 12 T and 4.2 K) and more in relation to the percentage of area of the superconductor in the overall cross-section of the wire and an RRR value in the stabilization copper of 150 or more.

Embodiments of the Semifinished Wire

In one preferred embodiment of the inventive semifinished wire, the filler elements directly abut the diffusion barrier on the outer side. A pre-inner element introduced during extrusion has thus been completely removed prior to introduction of the pre-filler elements and the pre-PIT elements. For this reason, a percentage of area of the cross-section of the subsequent superconducting wire, which is not available for superconductivity, is minimized and conversely the current carrying capacity is maximized.

In another preferred embodiment, a central filler element borders on the PIT elements on the outer side. The material of the central filler element may be matched to the mechanical loads acting across the cross-section of the semifinished wire during cross-section-reducing shaping, in particular drawing, which loads are particularly high in this case. The central filler element may, in particular, consist of copper. The contour of the central filler element typically corresponds to a hexagonal element or a bundle of hexagonal elements such that voids around the central filler element are prevented. It should be noted that the PIT elements are then typically also provided with a hexagonal cross-section.

In another preferred embodiment, the filler elements contain Cu. Filler elements containing Cu have a particularly good deformation behavior. The filler elements may contain, in particular, elementary copper.

In one advantageous embodiment, the PIT elements have a hexagonal cross-section. This facilitates handling and provides dense, uniform packing in the semifinished wire.

In one preferred embodiment, the small tubes of Nb or the alloy containing Nb in the PIT elements have a round cross-section. This enables a uniform residual thickness of unreacted tube material during or after reaction annealing over the entire circumference of the small tubes, which facilitates a high conversion degree into Nb3Sn and thus a high current carrying capacity.

In another preferred embodiment, the following applies to the percentage of area ADF of the diffusion barrier: 4%≤ADF≤8%. This has turned out to be useful in practice. A higher minimum portion of the diffusion barrier reduces the danger of Sn contamination in the Cu stabilization cladding tube and the lower maximum portion of the diffusion barrier reduces the cross-sectional portion that is not available for superconductivity.

It is also preferred for the Cu stabilization cladding tube to have a percentage of area ASH of cross-section of the semifinished wire of 12%≤ASH≤30%, preferably 18%≤ASH≤30%, preferentially 22%≤ASH≤27%. This percentage of area provides for good stabilization (thermally and electrically) and at the same time does not unnecessarily limit the percentage of area of the wire cross-section that is available for superconductivity.

In another preferred embodiment, the following applies to the wall thickness WDF of the diffusion barrier: 10 µm≤WDF≤22 µm. This has also turned out to be favorable in practice. The higher minimum thickness of the diffusion barrier reduces the danger of Sn contamination in the Cu stabilization cladding tube and the low maximum thickness of the diffusion barrier reduces the cross-sectional portion that is not available for superconductivity.

In one embodiment, the Cu stabilization cladding tube advantageously has an outer diameter DSH of 0.5 mm≤DSH≤1.2 mm, preferably 0.6 mm≤DSH≤0.9 mm. In this case, the wall thickness of the diffusion barrier is optimally matched to the size of the Cu stabilization cladding tube or of the semifinished wire or also of the superconducting wire (which is identical with respect to the cross-sectional dimensions).

In another preferred embodiment, the small tubes of Nb or an alloy containing Nb have a diameter DRö with 20 µm≤DRö≤55 µm, preferably 20 µm≤DRö≤45 µm. This size leads to particularly small magnetization losses in the finished superconducting wire, in particular smaller losses than in a typical "internal tin" wire.

In one advantageous embodiment, the Sn-containing powder cores contain an overall Sn portion GSn of at least 80 mass %, in particular, wherein 85 mass %≤GSn≤90 mass %. Preferred is also GSn≤82 mass %, preferentially GSn≤85 mass %. A high overall Sn portion achieves a high conversion degree of Nb to Nb3Sn and therefore a particularly high current carrying capacity in the finished superconducting wire.

In a particularly preferred embodiment, the diffusion barrier contains at least 50 mass % of Nb or at least 50 mass % of Ta. Ta as material of the diffusion barrier also acts as mechanical reinforcement and prevents the danger of forming Nb3Sn in the diffusion barrier during heat treatment. For this reason, a diffusion barrier on the basis of a Ta alloy does preferably not contain any niobium. A Ta barrier moreover results in reduced magnetization in the reaction-annealed wire containing Nb3Sn. A diffusion barrier of Nb or of an Nb alloy is comparatively inexpensive, in particular, in comparison with Ta. For this reason, a diffusion barrier on the basis of an Nb alloy preferably does not contain any Ta or, at the most, only a small amount of Ta (e.g. 10 mass % or less). However, it should be noted that NbTa alloys or materials or alloys on the basis of hafnium, zirconium, vanadium, molybdenum or titanium may also be used as material for the diffusion barrier.

The present invention also concerns a semifinished cable for a superconducting cable containing Nb3Sn, comprising a plurality of stranded inventive semifinished wires, in particular, wherein the semifinished cable is designed as a flat cable. A superconducting cable obtained from the semifinished cable transports very high currents in a superconducting fashion. The closed diffusion barrier continues to provide a reliable blocking function for Sn to the Cu stabilization cladding tubes even in case of deformations which occur e.g. in the production of flat cables, thereby also ensuring a high RRR value in the reaction-annealed flat cable.

The present invention also concerns a superconducting wire containing Nb3SnN or a superconducting cable containing Nb3Sn, produced through reaction annealing of an inventive semifinished wire or an inventive semifinished cable. The inventive design of the semifinished wire ensures high current carrying capacity in the superconducting wires with simultaneous high electric conductance in the normally conducting Cu stabilization cladding tubes.

In a particularly preferred embodiment of an inventive superconducting wire containing Nb3Sn or an inventive superconducting cable containing Nb3Sn, at least 80% of the Nb contained in the small tube has been reacted to an A15 phase during reaction annealing. Such a high conversion degree (and correspondingly high current carrying capacity) can be readily achieved in accordance with the invention since any breaking through of the reaction front of Nb3Sn or of the A15 phase through the small tube of Nb or an alloy containing Nb is basically unproblematic due to the diffusion barrier, and in particular does not lead to contamination of the Cu stabilization cladding tube with Sn.

In another preferred embodiment, the superconducting wire containing Nb3Sn or the superconducting cable containing Nb3Sn has a residual resistance ratio RRR of at least 100, preferably at least 150. Such residual resistance ratios are reliably available within the scope of the invention.

Variations of the Method of Producing the Semifinished Wire

In one preferred variation of the inventive method, the material for the pre-Cu stabilization cladding tube has an average particle size MKS directly prior to plastic deformation by extrusion, wherein $MKS \geq 2 \cdot MKI$, preferably $MKS \geq 5 \cdot MKI$. In other words, the material for the pre-inner element is considerably finer than the material for the CU stabilization cladding tube. This leads to a very small waviness of the pre-diffusion barrier after hydrostatic extrusion. MKS is typically 100 μm or more, mostly about 200-500 μm.

In another preferred variation, the pre-semifinished wire is subjected to extrusion and/or drawing and/or wire rolling in step d). These methods have turned out to be advantageous for cross-section-reducing shaping.

In another preferred variation, the materials for the outer jacket are heated directly prior to extrusion to a temperature $TSP \geq 450°$ C. This achieves a very good deformation behavior.

In one variation, a hollow cylinder is advantageously formed as pre-inner element in step a). For this reason, hydrostatic extrusion can be guided in a material-saving fashion and only a comparatively small amount of material must be removed prior to insertion of the pre-PIT elements in order to be able to provide them with a large percentage of cross-sectional area. Alternatively, a full cylinder may be formed as pre-inner element, which allows use of a simpler extrusion die.

In one preferred variation, in step b) material of the pre-inner element is mechanically removed, in particular by drilling or milling. Mechanical removal can be performed in a simple and fast fashion.

In one variation, material of the pre-inner element is alternatively or additionally chemically removed in step b). Chemical removal is material-friendly and does, in particular, not deform the material surfaces. If one or more mechanical removal steps and also one or more chemical removal steps are applied, the last removal step is preferably chemical removal.

In one particularly advantageous variation, the pre-inner element is completely removed from the outer jacket in step b). This provides a particularly large percentage of area of the cross-section for superconductivity. The pre-inner element is then mainly used to improve the deformation behavior during extrusion.

In another preferred variation, the material for the pre-inner element is selected as an alloy containing Cu—Sn, Cu—Ni, Cu—Zn or Cu—Al. These alloys lead to relatively small average particles sizes and overall fine-grained structures in the material for the pre-inner element, in particular, also during heating for extrusion to 450° C. or more.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and is explained in more detail with reference to embodiments. The figures, which are not drawn to scale, show:

BRIEF DESCRIPTION OF THE DRAWING

FIG. 5 a schematic overview of the process sequence concerning the production of an inventive semifinished wire, partial steps a) and b) in a first method variation with a pre-inner element formed as hollow cylinder;

FIG. 6 a schematic overview of the process sequence concerning the production of an inventive semifinished wire, partial steps a) and b) in a second method variation with a pre-inner element designed as a full cylinder;

DESCRIPTION OF THE PREFERRED EMBODIMENT

Figure 1:
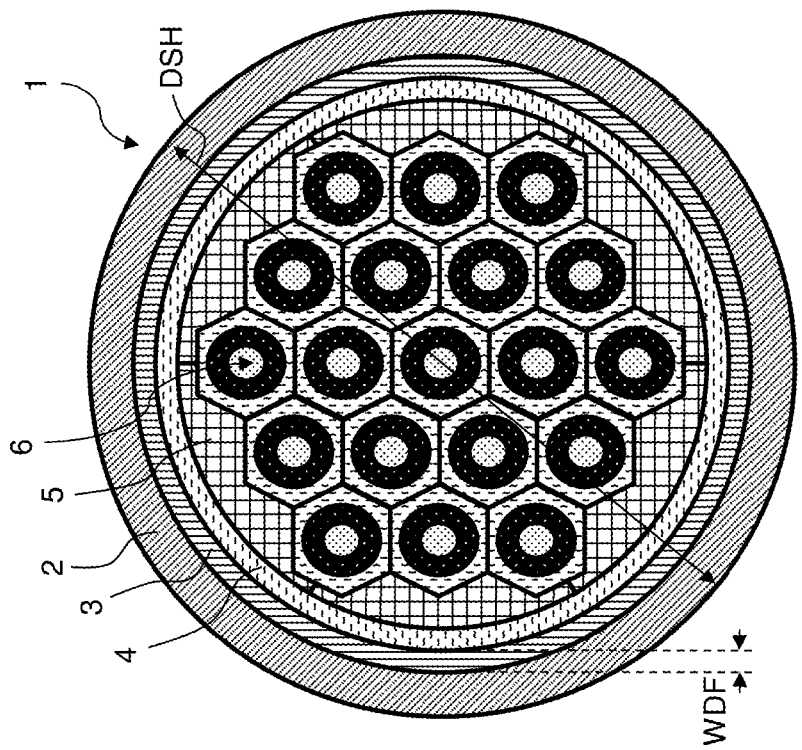
FIG. 1 a schematic cross-section of a first embodiment of an inventive semifinished wire with one inner element.

FIG. 1 shows a schematic cross-sectional view of a first embodiment of an inventive semifinished wire 1.

On its radial outer side, the semifinished wire 1 has a Cu stabilization cladding tube 2 which is produced from high purity copper (typically with a purity of 99.9 atom % or more). The Cu stabilization cladding tube 2 has a circular outer and inner cross-section in the present case. The percentage of area of the Cu stabilization cladding tube 2 with respect to the overall area of the semifinished wire 1 in cross-section is preferably approximately 22-27%, usually 24-25%, and the outer diameter DSH of the Cu stabilization cladding tube 2 or of the semifinished wire 1 is preferably approximately 0.6-0.9 mm, usually 0.7-0.85 mm.

A tubular diffusion barrier 3 with a ring-shaped closed cross-section abuts the inner side of the Cu stabilization cladding tube 2. In the present case, the diffusion barrier 3 is produced from niobium and preferably has a wall thickness WDF of 10-20 μm. The percentage of area of the diffusion barrier 3 with respect to the overall area of the semifinished wire 1 in cross-section is preferably approximately 4-8%, usually 5-6%. The wall thickness WDF of the diffusion barrier 3 is substantially constant over its circumference and there is no noticeable waviness in the diffusion barrier. In practice, the inner radius and the outer radius of the diffusion barrier 3 each vary in cross-section by typically at most 10% relative to the respective maximum inner and outer radii.

In the illustrated embodiment, an inner element 4, which remained from the pre-inner element after hydrostatic extrusion, abuts the inner side of the diffusion barrier 3. The inner element 4 is typically produced of a copper alloy, preferably a CuSn alloy. The wall thickness of the inner element 4 is preferably set at a minimum value, typically 15 μm or less.

The inner element 4 (or the associated pre-inner element) protects the diffusion barrier 3 from damage in the course of the production process.

A set of 6 filler elements 5 in the present case abuts the inside of the inner element 4. The filler elements 5 are circularly curved on their outer sides corresponding to the abutting inner side of the inner element 4, and have a profile on the inner side corresponding to the abutting hexagonally profiled PIT elements 6. The filler elements 5 are typically produced from copper. In the illustrated embodiment, a bundle of 19 PIT elements 6 is surrounded by the filler elements 5, however, more PIT elements 6 could also be provided, e.g. 50 or more PIT elements 6. The PIT elements 6 are explained in more detail in connection with FIG. 4. The diffusion barrier 3 prevents any Sn that might leak from the PIT elements 6 from getting into the Cu stabilization cladding tube 2. The Cu stabilization cladding tube 2 therefore retains a high electrical conductivity after reaction annealing.

Figure 8:
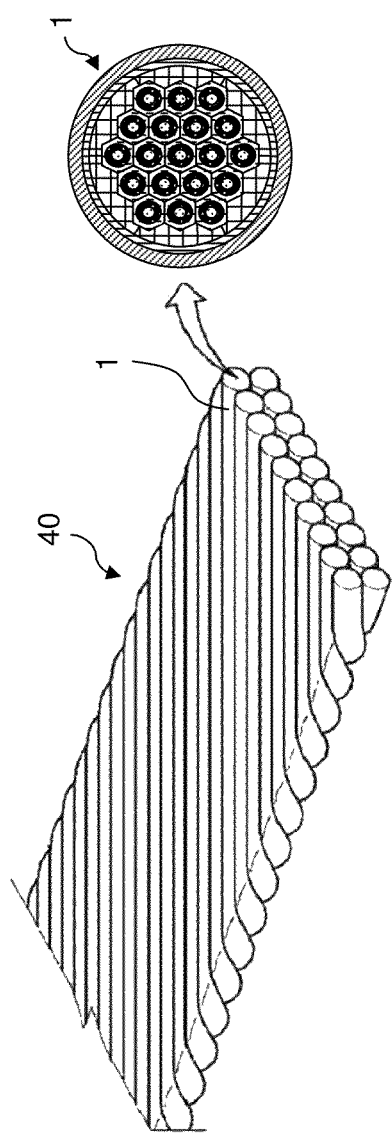
FIG. 8 a schematic inclined view of an inventive semifinished cable.
Figure 9:
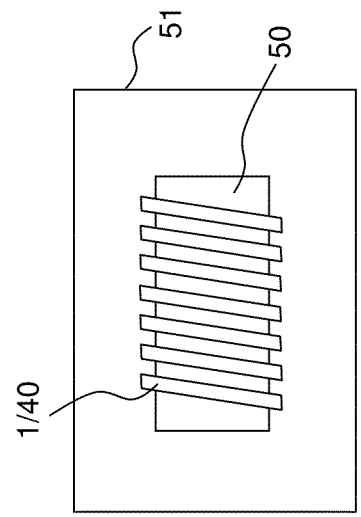
FIG. 9 a schematic view of a magnet coil wound with an inventive semifinished cable during reaction annealing.

The illustrated semifinished wire 1 has already been adjusted to the final dimensions intended for reaction annealing through suitable shaping measures, e.g. drawing, and can be bundled and positioned (e.g. stranded into a semifinished cable and wound onto a coil carrier) for the desired application, if desired, cf. FIGS. 8 and 9 in this connection.

Figure 2:
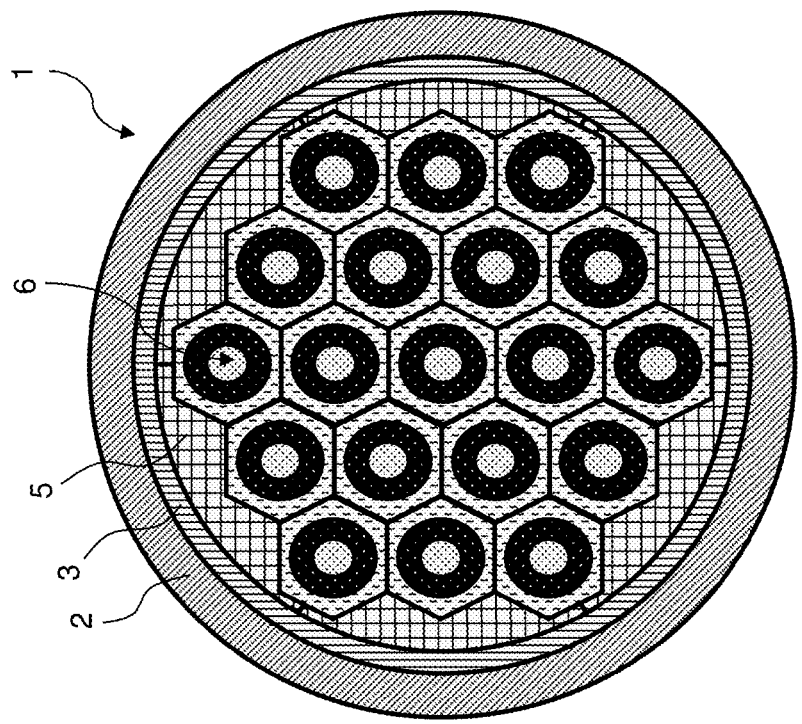
FIG. 2 a schematic cross-section of a second embodiment of an inventive semifinished wire with filler elements that directly abut the diffusion barrier.

FIG. 2 shows a schematic cross-section of a second embodiment of an inventive semifinished wire 1 similar to the embodiment shown in FIG. 1. For this reason, only the substantial differences are explained.

In the embodiment illustrated in FIG. 2, the filler elements 5 directly abut the diffusion barrier 3 on the outer side. An inner element is not provided. For this reason, it is possible to provide more area for the PIT elements 6 in the inside of the diffusion barrier 3. The PIT elements 6 can correspondingly move closer to the diffusion barrier 3.

Figure 3:
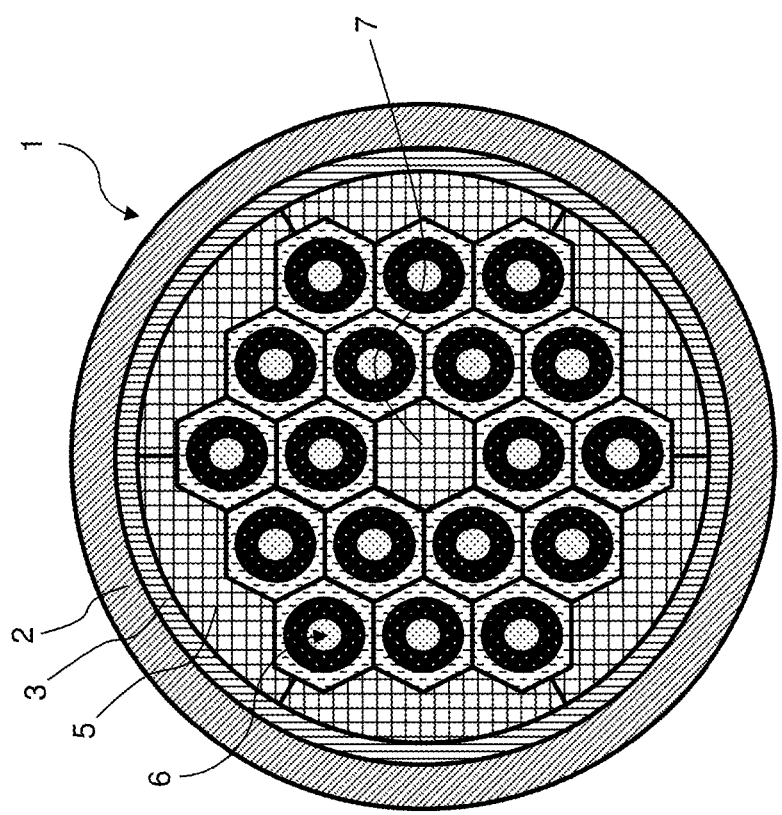
FIG. 3 a schematic cross-section of a third embodiment of an inventive semifinished wire with a central filler element.

FIG. 3 shows a schematic cross-section of a third embodiment of an inventive semifinished wire 1 similar to the embodiment illustrated in FIG. 2. For this reason, only the substantial differences are explained.

In the embodiment illustrated in FIG. 3, a central filler element 7 is provided in the inside of the bundle of 18 PIT elements 6 in the present case, the filler element taking up a space that corresponds to a hexagonal PIT element. It should be noted that the taken-up space in other embodiments can also correspond to a plurality of PIT elements, e.g. three or seven or more. The central filler element 7 is typically produced from the same material as the filler elements 5, e.g. of copper. The central filler element 7 avoids high mechanical load on PIT elements in case of cross-section-reducing shaping.

Figure 4:
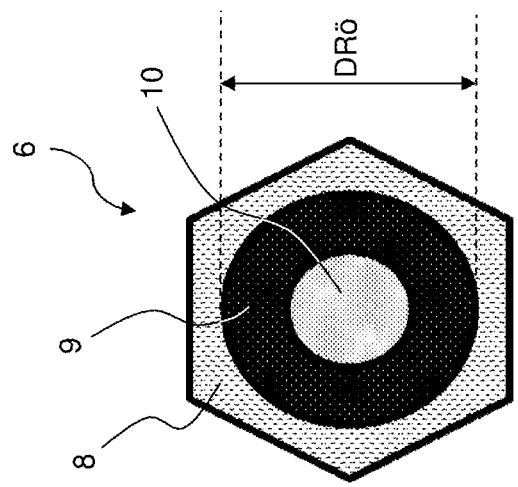
FIG. 4 a schematic cross-section through an individual PIT element for an inventive semifinished wire.

FIG. 4 shows a schematic cross-section of an individual PIT element 6 for an inventive semifinished wire as shown e.g. in FIGS. 1 to 3.

The PIT element 6 has a cladding 8 containing Cu, in the present case consisting of elementary copper, which has a hexagonal cross-section on the outer side and a circular cross-section on the inner side (for this purpose e.g. a hexagonal outer cross-section was initially drawn and subsequently a circular bore was introduced). A small tube 9 of Nb or an Nb alloy (e.g. NbTa) abuts the inside of the Cu-containing cladding 8. The small tube 9 is filled with a powder core 10 that contains Sn, e.g. with a mixture of elementary Sn, Nb6Sn5 and/or NbSn2, wherein the overall portion of Sn in the powder core is typically at least 80 mass %, preferably at least 82 mass %. The powder core 10 is typically compacted, e.g. compressed. The small tubes 9 with circular cross-section of the PIT elements 6 preferably have an outer diameter DRö of 20-45 μm, mostly 30-40 μm in the semifinished wire that has been shaped to the final dimensions.

During reaction annealing, Sn can diffuse from the powder core 10 into the small tube 9 and be converted there to Nb3Sn. In this connection, a reaction front moves from the inside to the outside. The invention permits further advance of the reaction front such that typically at least 80% of the Nb contained in the small tube 9 (including powder core 10) and preferably the overall amount of Nb that is present are converted into an A15 phase, in particular Nb3Sn. Any breakthrough of Sn through the small tube 9 is basically unproblematic since the diffusion barrier protects the Cu stabilization cladding tube of the semifinished wire.

FIG. 5 illustrates a first variation of a first part of an inventive method for producing an inventive semifinished wire, e.g. a semifinished wire according to FIG. 2. The figure predominantly shows cross-sections, however, on the right-hand side, a longitudinal section of the extruder.

Within the scope of a first step a) of the inventive method, a block 11 is subjected to hydrostatic extrusion.

In the present case, the block 11 comprises a hollow cylinder 12 of a material for a pre-inner element which is inserted into a tube 13 of a material for a pre-diffusion barrier and also a tube 14 of a material for a pre-Cu stabilization cladding tube, into which the tube 13 including hollow cylinder 12 is inserted.

The block 11 is arranged in a pressure fluid 15 in a recipient 17. The pressure fluid 15, sealed by the high-pressure seals 15a, is loaded with pressure (typically more than 10 kbar) by means of an extrusion die 16 and the block 11 is extruded through a narrowing die 18. The block 11 is heated such that it has a temperature TSP of 450° C. or more, mostly approximately 500° C., directly prior to and also during extrusion.

The (metallic) material for the pre-inner element and the (metallic) material for the pre-diffusion barrier are selected such that directly prior to extrusion (i.e. after heating for extrusion but prior to entry into the die 18) the following applies to an average particle size MKI of the material for the pre-inner element and an average particle size MKD of the material for the pre-diffusion barrier: MKI≤3*MKD, preferably MKI 1*MKD. Directly prior to extrusion the following typically also applies to an average particle size MKS of the (metallic) material for the pre-Cu stabilization cladding tube: MKS≥2*MKI, preferably MKS≥5*MKI.

Extrusion of the block 11 produces an outer jacket 20 which has a smaller outer diameter than the block 11. The outer jacket 20 consists of a pre-stabilization cladding tube 21, a pre-diffusion barrier 22 which abuts the inner side of the pre-stabilization cladding tube, and a pre-inner element 23 which abuts the inner side of the pre-diffusion barrier and is formed to be hollow (tubular) with a central cavity 24 in the present case. Due to the above structural specifications for the materials which are shaped during hydrostatic extrusion, the waviness in the pre-diffusion barrier 22 (which also determines the waviness of the subsequent diffusion barrier in the semifinished wire or in the finished superconducting wire) can be kept small.

In the second step b) of the method, material of the pre-inner element 23 is removed. In the illustrated variation, the diameter of the central cavity 24 is initially enlarged through mechanical material removal, e.g. milling or drilling. A pre-inner element 23a with reduced wall thickness and enlarged cavity 24a initially remains. In this case, the remaining pre-inner element 23a is then completely chemically removed, e.g. by etching, e.g. by means of nitric acid in case the pre-inner element 23 consists of bronze. In the illustrated variation, the subsequently remaining outer jacket 20a thus only consists of the pre-Cu stabilization cladding tube 21 and the pre-diffusion barrier 22 with a cavity 25 which borders the pre-diffusion barrier 22 on the inner side. It should be noted that the cavities 24, 24a, 25 extend over a considerable length of the outer jacket 20, 20a (in FIG. 5 perpendicularly to the plane of the drawing) and material is removed throughout this overall length.

Alternatively, a rest of the pre-inner element 23 or 23a may also remain in the outer jacket 20a in order to ensure the intactness or sufficient thickness at any point of the pre-diffusion barrier 22 with more reliability, in particular after mechanical material removal.

FIG. 6 shows a second variation for a first part of an inventive method for producing an inventive semifinished wire, e.g. a semifinished wire according to FIG. 2. The second variation is similar to the first variation of FIG. 5 such that only the essential differences are shown.

In the variation shown in FIG. 6, a full cylinder 26 of a material for a pre-inner element is used for block 11 in step a) and is inserted into the tube 13 of a material for a pre-diffusion barrier. The tube 13 including full cylinder 26 is inserted into the tube 14 of a material for a pre-Cu stabilization cladding tube.

The outer jacket 20 obtained through extrusion of the block 11 then contains in the pre-diffusion barrier 22 a fully cylindrical pre-inner element 27. A cavity 28 is then introduced into the pre-inner element 27 through mechanical material removal, in particular drilling. The remaining pre-inner element 27 is subsequently completely chemically removed again, e.g. by etching.

One again obtains a remaining outer jacket 20a consisting of the pre-Cu stabilization cladding tube 21 and the pre-diffusion barrier 22 with a cavity 25 which borders the pre-diffusion barrier 22 on the inner side.

Figure 7:
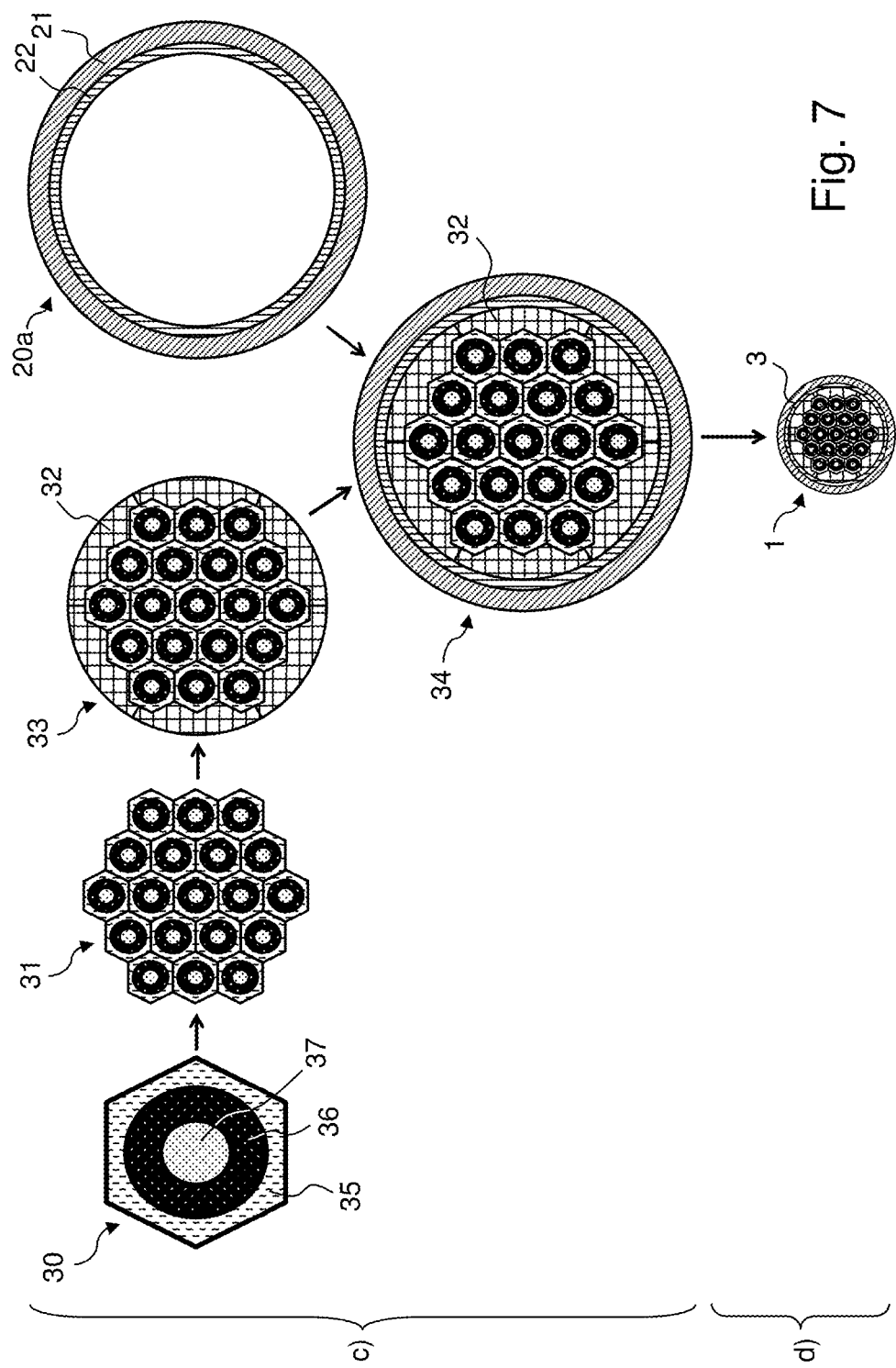
FIG. 7 a schematic overview of the process sequence concerning the production of an inventive semifinished wire, partial steps c) and d), thereby using an outer jacket with completely removed pre-inner element.

FIG. 7 schematically illustrates the further progress of the production of an inventive semifinished wire, for example subsequent to steps a) and b) in accordance with FIG. 5 or FIG. 6. The figure shows cross-sections.

In a third step c) a plurality of pre-PIT elements 30 are arranged in a bundle 31 and pre-filler elements 32 are arranged around them. This ensemble 33 is arranged in the outer jacket 20a that remains (after in this case complete removal of the pre-inner element) and is therefore arranged inside the pre-diffusion barrier 22. In this fashion, one obtains a pre-semifinished wire 34. No noticeable cavities remain between the remaining outer jacket 20a and the pre-filler elements 32, and in the overall pre-semifinished wire 34.

In step d), the pre-semifinished wire is then subjected to cross-section-reducing shaping, e.g. extrusion, drawing or wire rolling. It should be noted that shaping can also be performed in a plurality of stages and in sequences of different shaping techniques. After shaping, an inventive semifinished wire 1 is obtained which has a reduced outer diameter compared with the pre-semifinished wire 34. The diffusion barrier 3 of the semifinished wire 1 does not show any noticeable waviness after reduction of the cross-section.

In accordance with the present invention, intermediate annealing is generally not performed after extrusion of step a) up to and including cross-section-reducing shaping of step d) and including any possible stranding into a semifinished cable and positioning of the semifinished wire or semifinished cable, which keeps production simple. However, in certain semifinished wire designs, in particular without elementary Sn in the powder cores of the PIT elements, one or more intermediate annealing steps may also be advantageously applied within the scope of the invention.

It should be noted that the pre-PIT elements 30, the pre-filler elements 32, the pre-Cu stabilization cladding tube 21 and the pre-diffusion barrier 22 substantially correspond to the PIT elements 6, the filler elements 5, the Cu stabilization cladding tube 2 and the diffusion barrier 3 in the semifinished wire 1, however, have even larger dimensions since cross-section-reducing shaping has not yet been performed. In particular, a pre-PIT element 30 comprises a Cu-containing pre-cladding 35, a pre-tube 36 of Nb or an Nb alloy and a pre-powder core 37.

As can be gathered from FIG. 8, a plurality of semifinished wires 1 can be stranded (twisted) into a semifinished cable 40, in the present case designed as flat cable. It should be noted that in addition to flat cables with rectangular cross-section, flat cables with wedge-shaped cross-section can also be produced. Typical flat cables for the invention have a cross-sectional aspect ratio of 4 or more. The short cable edges of semifinished wires 1 of the flat cables experience strong deformation which can be easily tolerated by an inventive semifinished wire 1. Flat cables are typically further processed (not shown in detail) into windings in the form of a race track coil for magnet windings. Moreover, non-flat cables 40, e.g. cables having a circular cross-section, can also be produced from a plurality of semifinished wires 1 (not shown in detail).

A semifinished wire 1 or a semifinished cable 40 can be wound, in particular as done with solenoid coils, onto a cylindrical coil carrier 50 and be subjected to reaction annealing in an annealing furnace 51, cf. FIG. 9. Race track coils can e.g. also be subjected to reaction annealing in the annealing furnace 51 (not shown in detail). During reaction annealing (typically at 600-700° C. for some days up to some weeks) the superconducting A15 phase is formed in the PIT elements of the used semifinished wires, in particular Nb3Sn, wherein contamination of the Cu stabilization cladding tubes is prevented by the diffusion barriers. The diffusion barriers thereby require only a very small percentage of area such that, conversely, a large percentage of area is available for the A15 phase in the respective superconducting wire obtained from a semifinished wire. Moreover, a large amount of Sn can be stored in the semifinished wire such that a very large portion of the Nb contained in the PIT elements, in particular in the area of the previous small tubes, can be converted into the A15 phase. Correspondingly, very high current carrying capacities of the finished superconducting wires containing Nb3Sn or of the finished superconducting cable containing Nb3Sn can be achieved.

Experimental Data

Figure 10B:
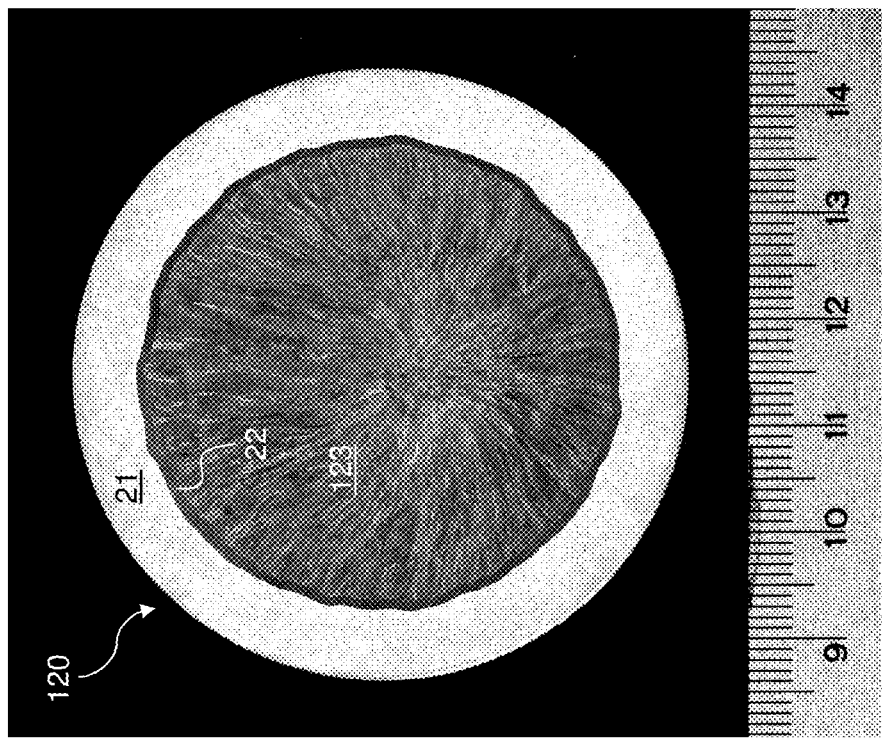
FIG. 10b a photo-optical recording of a transverse section of a conventionally produced outer jacket with an inner core of Cu.
Figure 10A:
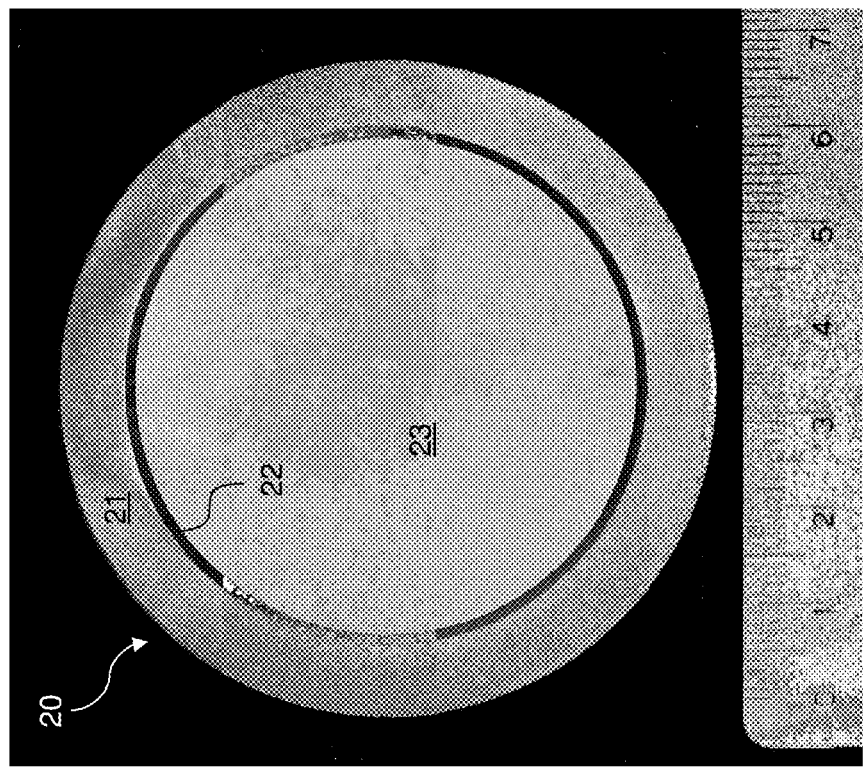
FIG. 10a a photo-optical recording of a transverse section of an outer jacket produced according to step a) of the inventive method with a pre-inner element of a CuSnTi alloy.

The inventive procedure for the production of an outer jacket for an inventive semifinished wire, cf. in this connection in particular step a) of the inventive production method, through extrusion was tested by means of example using a production example with a pre-inner element from a full cylinder. In this connection, see for example FIG. 6, top. For comparison, an outer jacket for a semifinished wire was moreover conventionally produced through extrusion. The outer jackets obtained were prepared in transverse section. FIG. 10a shows a photo-optical recording (including a cm scale) of an outer jacket 20 produced in accordance with the invention, and FIG. 10b shows a photo-optical recording (including a cm scale) of the conventionally produced outer jacket 120.

TABLE 1 outer jacket produced in accordance with the invention (FIG. 10a)

| structure | material | Percentage of area | Average particle size cold prior to extrusion | Average particle size warm prior to extrusion | Average particle size after extrusion |
|---|---|---|---|---|---|
| Cu stabilization cladding tube 21 | Cu OFE | 25% | 200 μm | 300 μm | 200 μm |
| Diffusion barrier 22 | Nb | 6% | 60 μm | 60 μm | <60 μm* |
| Pre-inner element 23 | CuSnTi | 69% | 20 μm | 20 μm | 20 μm |

*subparticle size, structure not recrystallized

A CuSnTi alloy for the pre-inner element 23 was used for the outer jacket 20 produced in accordance with the invention, which had an average particle size MKI in the warm state (directly prior to extrusion) of 20 μm in the present case. The niobium for the pre-diffusion barrier 22 had an average particle size MKD of 60 μm in the warm state (directly prior to extrusion). Cu OFE for the pre-Cu stabilization cladding tube 21 had an average particle size MKS of 300 μm in the warm state (directly prior to extrusion).

Cu OFE was again used for the pre-Cu stabilization cladding tube 21 for the conventionally produced outer jacket 120 and Nb was used for the pre-diffusion barrier 22 (see above). However, cast copper was used for the pre-inner element 123.

After extrusion of the outer jacket 20 with the pre-inner element 23 of the CuSnTi alloy, a very smooth wall of the diffusion barrier 22 was obtained without noticeable waviness with a thickness of approximately 1.5 mm (FIG. 10a).

On the contrary, the pre-diffusion barrier 22 of the outer jacket 120 produced with the pre-inner element 123 of cast copper shows a considerable waviness (FIG. 10b). The outer radius of the pre-diffusion barrier 22 varies here by approximately 0.5 mm with a thickness of the pre-diffusion barrier 22 of also approximately 1.5 mm. This considerable waviness can lead to gaps in the diffusion barrier in subsequent cross-section-reducing shaping steps. The contours of the particles in the cast structure of the pre-inner element 123 are made visible in FIG. 10b through etching. Due to the size of the contours of the particles after extrusion on a scale from mm to cm, it can be concluded that the particles were at least also present on a scale from mm to cm prior to extrusion.

We claim:

1. A semifinished wire for a superconducting wire containing Nb3Sn, the semifinished wire comprising:
   a Cu stabilization cladding tube;
   a ring-shaped closed diffusion barrier disposed within said Cu stabilization cladding tube, said diffusion barrier having a percentage of area ADF in cross-section of the semifinished wire of 3%≤ADF≤9% and a wall thickness WDF with 8 μm≤WDF≤25 μm;
   a plurality of filler elements disposed within said diffusion barrier; and
   a plurality of PIT elements disposed within said filler elements such that inner sides of said filter elements abut said PIT elements, wherein each PIT element comprises a cladding containing Cu, a small tube made of Nb or an alloy containing Nb, and a powder core containing Sn.

2. The semifinished wire of claim 1, wherein outer sides of said filler elements directly abut said diffusion barrier.

3. The semifinished wire of claim 1, further comprising a central filler element having an outer side bordering said PIT elements.

4. The semifinished wire of claim 1, wherein said filler elements contain Cu.

5. The semifinished wire of claim 1, wherein said PIT elements have a hexagonal cross-section.

6. The semifinished wire of claim 1, wherein said small tubes of Nb or of said alloy containing Nb have a round cross-section.

7. The semifinished wire of claim 1, wherein following applies to a percentage of area ADF of said diffusion barrier: 4%≤ADF≤8%.

8. The semifinished wire of claim 1, wherein said Cu stabilization cladding tube has a percentage of area ASH in cross-section of the semifinished wire of 12%≤ASH≤30%, 18%≤ASH≤30% or 22%≤ASH≤27%.

9. The semifinished wire of claim 1, wherein following applies to said wall thickness WDF of said diffusion barrier: 10 μm≤WDF≤22 μm.

10. The semifinished wire of claim 1, wherein said Cu stabilization cladding tube has an outer diameter DSH of 0.5 mm≤DSH≤1.2 mm or 0.6 mm≤DSH≤0.9 mm.

11. The semifinished wire of claim 1, wherein said small tubes of Nb or an alloy containing Nb have a diameter DRö, with 20 μm DRö55 μm or 20 μm≤DRö≤45 μm.

12. The semifinished wire of claim 1, wherein said Sn-containing powder cores contain an overall Sn portion GSn of at least 80 mass % or 85 mass %≤GSn≤90 mass %.

13. The semifinished wire of claim 1, wherein said diffusion barrier contains at least 50 mass % of Nb or at least 50 mass % of Ta.

14. A semifinished cable or a flat semifinished cable for a superconducting cable containing Nb3Sn, comprising a stranded plurality of the semifinished wires of claim 1.

15. A superconducting wire containing Nb3Sn or a superconducting cable containing Nb3Sn, produced through reaction annealing of the semifinished wire of claim 1.

16. The superconducting wire or cable of claim 15, wherein at least 80% of Nb contained in said small tube has been reacted to an A15 phase during reaction annealing.

17. The superconducting wire or cable of claim 15, wherein the superconducting wire containing Nb3Sn or the superconducting cable containing Nb3Sn has a residual resistance ratio RRR of at least 100 or of at least 150.

18. A method for the production of the semifinished wire of claim 1, the method comprising the steps of:
  a) producing an outer jacket through extrusion or through hydrostatic extrusion, the outer jacket comprising a pre-Cu stabilization cladding tube, a pre-diffusion barrier disposed within the pre-Cu stabilization cladding tube and a pre-inner element disposed within the pre-diffusion barrier, wherein a material for the pre-inner element is selected such that, directly prior to plastic deformation through extrusion, an average particle size MKI of the material for the pre-inner element is maximally 3 times as large as an average particle size MKD of a material for the pre-diffusion barrier;
  b) removing at least part of the pre-inner element from the outer jacket along a length of the outer jacket;
  c) disposing a plurality of pre-PIT elements together with a plurality of pre-filler elements within the pre-diffusion barrier, wherein the pre-filler elements are adjacent to an inner side of a remaining outer jacket and are adjacent to the pre-PIT elements; and
  d) subjecting, following steps a) through c), the pre-semifinished wire to cross-section-reducing shaping, thereby obtaining the semifinished wire.

19. The method of claim 18, wherein the material for the pre-Cu stabilization cladding tube has an average particle size MKS directly prior to plastic deformation by extrusion, wherein $MKS \geq 2 \cdot MKI$ or $MKS \geq 5 \cdot MKI$.

20. The method of claim 18, wherein, in step d), the pre-semifinished wire is subjected to extrusion and/or drawing and/or wire rolling.

21. The method of claim 18, wherein materials for the outer jacket are heated to a temperature $TSP \geq 450°$ C. directly prior to extrusion.

22. The method of claim 18, wherein a hollow cylinder is formed as the pre-inner element in step a).

23. The method of claim 18, wherein, in step b,) material of the pre-inner element is mechanically removed from the outer jacket, is mechanically removed from the outer jacket by drilling or milling, is chemically removed from the outer jacket or is completely removed from the outer jacket.

24. The method of claim 18, wherein the material for the pre-inner element is selected as an alloy containing Cu—Sn, Cu—Ni, Cu—Zn or Cu—Al.

* * * * *